United States Patent
Kusserow et al.

(10) Patent No.: US 11,524,876 B2
(45) Date of Patent: Dec. 13, 2022

(54) METHOD AND MONITORING DEVICE FOR MONITORING AN OPERATION OF AN ELEVATOR DOOR ARRANGEMENT

(71) Applicant: Inventio AG, Hergiswil (CH)

(72) Inventors: Martin Kusserow, Lucerne (CH); Zack Zhu, Baar (CH); Jose Alberto Mancera Andrade, Lucerne (CH)

(73) Assignee: INVENTIO AG, Hergiswil (CH)

( * ) Notice: Subject to any disclaimer, the term of this patent is extended or adjusted under 35 U.S.C. 154(b) by 388 days.

(21) Appl. No.: 16/638,238

(22) PCT Filed: Jul. 24, 2018

(86) PCT No.: PCT/EP2018/069964
§ 371 (c)(1),
(2) Date: Feb. 11, 2020

(87) PCT Pub. No.: WO2019/034376
PCT Pub. Date: Feb. 21, 2019

(65) Prior Publication Data
US 2020/0198933 A1     Jun. 25, 2020

(30) Foreign Application Priority Data
Aug. 17, 2017 (EP) ..................................... 17186582

(51) Int. Cl.
*B66B 13/06* (2006.01)
*B66B 5/00* (2006.01)
(Continued)

(52) U.S. Cl.
CPC ............ *B66B 13/06* (2013.01); *B66B 5/0037* (2013.01); *B66B 13/08* (2013.01); *G01R 19/16533* (2013.01)

(58) Field of Classification Search
CPC ....... B66B 13/06; B66B 5/0037; B66B 13/08; G01R 19/16533
See application file for complete search history.

(56) References Cited

U.S. PATENT DOCUMENTS

| | | |
|---|---|---|
| 6,439,350 B1 | 8/2002 | Lence Barreiro et al. |
| 2019/0010019 A1* | 1/2019 | Koushik ................. B66B 13/24 |
| 2019/0010021 A1* | 1/2019 | Sarkar ................... B66B 5/0025 |

FOREIGN PATENT DOCUMENTS

| | | |
|---|---|---|
| CN | 101823663 A | 9/2010 |
| CN | 103708329 A | 4/2014 |

(Continued)

*Primary Examiner* — Jeffrey Donels
(74) *Attorney, Agent, or Firm* — William J. Clemens; Shumaker, Loop & Kendrick, LLP

(57) ABSTRACT

An elevator door arrangement is monitored wherein the elevator door arrangement includes at least one door wing and an electric actuator for displacing the door wing in at least one of an opening direction and a closing direction during a door motion event. A method for performing the monitoring includes a learning phase and an application phase. During the learning phase, different types of door motion events are identified and for each type of event a reference motion event duration is determined. During the application phase, a door arrangement operation is observed such as to detect door motion events and the different types of door motion events are distinguished upon comparison of the reference motion event durations with actual motion event durations measured during the application phase. Using the method, door motion events in an elevator may be recognized and monitored in an automatic manner.

13 Claims, 1 Drawing Sheet

5 electric actuator
9 door controller
11 monitoring device
13 sensor
15 remote control center

(51) Int. Cl.
*B66B 13/08* (2006.01)
*G01R 19/165* (2006.01)

(56) References Cited

FOREIGN PATENT DOCUMENTS

| | | | |
|---|---|---|---|
| CN | 103827011 | A | 5/2014 |
| CN | 104291174 | A | 1/2015 |
| CN | 105452139 | A | 3/2016 |
| CN | 106115401 | A | 11/2016 |
| CN | 106573759 | A | 4/2017 |
| EP | 0679603 | A2 | 11/1995 |
| EP | 1661842 | A1 | 5/2006 |
| JP | H05294588 | A | 11/1993 |
| JP | 2007168989 | A | 7/2007 |
| JP | 2013189302 | A | 9/2013 |
| JP | 2015020864 | A | 2/2015 |
| WO | 2017016876 | A1 | 2/2017 |

\* cited by examiner 5 electric actuator
9 door controller
11 monitoring device
13 sensor
15 remote control center

METHOD AND MONITORING DEVICE FOR MONITORING AN OPERATION OF AN ELEVATOR DOOR ARRANGEMENT

FIELD

The present invention relates to a method and a monitoring device for monitoring an operation of an elevator door arrangement of an elevator. Furthermore, the present invention relates to a computer program product for performing or controlling the proposed method and to a computer readable medium comprising such computer program product stored thereon.

BACKGROUND

Elevators typically comprise a car, which may be displaced along a vertical displacement path and stopped at different car stopping positions at various levels in a building. Generally, the car comprises an elevator car door arrangement comprising at least one displaceable door wing which may be opened and closed. Additionally or alternatively, the elevator comprises shaft door arrangements at each of the car stopping positions in the building, the shaft door arrangements each comprising at least one displaceable door wing. In most cases, at least the elevator car door arrangement comprises an electric actuator for actively displacing its at least one door wing. The elevator shaft door arrangement is, in many cases, passively driven upon cooperating with the actively driven elevator car door arrangement, i.e. has no own electric actuator for displacing its at least one car door wing. However, there may be exceptions where also the elevator shaft door arrangement is actively driven and comprises an electric actuator.

Generally, functionalities and operations within an elevator may have to be monitored in order to for example enable guaranteeing safe operation of the elevator and/or enable efficient operation of the elevator.

For example, numbers and/or types of operations of certain elevator components should be monitored in order to enable timely maintenance or replacement of such elevator components upon for example wear deteriorations occurring at the elevator components. On the one hand, excessively early maintenance or replacement should be avoided in order to save money and effort for such maintenance or replacement. On the other hand, excessively late maintenance or replacement should be avoided in order to avoid any subsequent failures in the elevator due to failures occurring in the elevator components e.g. having exceeded its lifetime.

Alternatively or additionally, any extraordinary or abnormal behavior of the elevator components should be detected in order to enable suitable maintenance or replacement of such elevator components upon for example wear or damages occurring at the elevator components.

WO 2017/016876 A1 discloses a method and a device for determining an operating state of an elevator system. Therein, the current/time profile of a current supplied to the elevator system via a power supply line is determined, at least one current profile segment of the recorded current/time profile is identified and a current profile pattern of the identified current profile segment is derived. Then, an operating state of the elevator system is determined on a basis of a comparison of the current profile pattern and with at least one reference pattern. WO 2017/016876 A1 has been filed by the applicant of the present application and describes several details of for example measuring actual currents within a power supply line, which details may be applied or adapted for embodiments of the invention described herein. Therefore, the content of WO 2017/016876 A1 shall be included by reference in its entirety into the present application.

JP 2015-020864 A discloses a diagnostic system for elevator doors. The diagnostic system learns reference data on a driving force corresponding to an opening/closing position of a car door and diagnostic data in a state in which the car door and a hall door are not engaged by the door engagement part, and diagnoses abnormality of the car door based upon reference data on the car door.

SUMMARY

There may be a need for an alternative method and monitoring device for monitoring an operation of an elevator car door arrangement in an elevator. Particularly, such method and monitoring device may be adapted for simply and reliably determining numbers and/or types of operations of the elevator door arrangement and/or for detecting any extraordinary or abnormal behavior of the elevator door arrangement. Furthermore, there may be a need for an elevator comprising such monitoring device, for a computer program product which, when executed in a programmable monitoring device, instructs the monitoring device for performing or controlling the proposed method and for a computer readable medium comprising such computer program product stored thereon.

Such needs may be met with the subject-matter of the embodiments defined in the following specification.

According to a first aspect of the present invention, a method for monitoring an operation of an elevator door arrangement is proposed. Therein, the elevator door arrangement comprises at least one door wing and an electric actuator for displacing the door wing in an opening and/or a closing direction during a door motion event. The method comprises a learning phase and an application phase. Therein, during the learning phase, different types of door motion events are identified and for each type of door motion event a reference motion event duration is learned. Furthermore, during the application phase, a door arrangement operation is observed such as to detect door motion events and the different types of door motion events are distinguished upon comparison of the learned reference motion event durations with actual motion event durations as measured during the application phase.

According to a second aspect of the present invention, a monitoring device for monitoring an operation of an elevator door arrangement is proposed, the monitoring device being configured for at least one of performing and controlling the method according to an embodiment of the first aspect of the invention.

According to a third aspect of the invention, an elevator comprising an elevator door arrangement and a monitoring device according to an embodiment of the second aspect of the invention is proposed.

According to a fourth aspect of the invention, a computer program product is proposed, the computer program product comprising computer readable instructions which, when performed by a processor of a monitoring device, instruct the monitoring device to perform and/or control the method according to an embodiment of the first aspect of the invention.

According to a first aspect of the invention, a computer readable medium comprising a computer program product according to an embodiment of the fourth aspect of the invention is proposed.

Ideas underlying embodiments of the present invention may be interpreted as being based, inter alia and without restricting a scope of the invention, on the following observations and recognitions.

As indicated above, an operation of an elevator door arrangement should be monitored in order to enable for example timely maintenance or replacement in case of failures or wear deteriorations.

As explained in detail with regard to specific embodiments in WO 2017/016876 A1, an elevator door operation may be monitored by determining a time profile of an electric current supplied to an actuator of the elevator door and comparing portions of this time profile with reference profiles which may have been acquired for example in a non-deteriorated state of the elevator door. Therein, the portions of the time profile may represent an electric current time profile which occurs upon specific door motion events such as opening, closing or reversing and elevator door being performed.

However, such acquiring and comparing of time profiles may be technically complex to implement. Furthermore, manual actions to be performed by specifically trained personnel may be required upon implementing the sophisticated prior art method for monitoring elevator door operation. For example, manual actions may be required for determining start and stop points in time in a current profile, which is obtained by continuously measuring the supply current, in order to thereby determine the portions of the time profile representing desired door motion events.

Embodiments of the present invention allow a simplified approach for monitoring an operation of an elevator door arrangement. Therein, the proposed method comprises a learning phase and an application phase. During the learning phase, data or information may be acquired which may later, in the application phase, be used for monitoring the operation of the elevator door arrangement.

Particularly, during the learning phase, different types of door motion events are identified. For example, such door motion events may include:

a door opening motion in which an elevator door wing is moved from a completely closed state to a completely open state, a door closing motion in which the elevator door wing is moved from a completely open state to a completely closed state, and a door reversal motion, in which the elevator door is first moved from its completely open state towards the closed state but is then reversed before reaching the completely closed state, for example due to a person entering the elevator car and interrupting a light curtain.

Furthermore, during the learning phase, a reference motion event duration is determined and associated to each of the types of identified door motion events. In other words, for each of the identified door motion events, a duration is determined which represents the time typically needed for performing the door motion event, i.e. a duration for completely closing the door wing during a door closing motion, a duration for completely opening the door wing during a door opening motion and a scope of durations needed for door wing motion during a door reversal motion are determined, respectively.

Later, during the application phase, the door arrangement operation may be observed continuously or repeatedly and criteria may be applied such as to detect door motion events upon such observations. As explained in more detail further below, such door arrangement operation may be observed for example by measuring and analyzing an electric supply current to the electric actuator of the elevator door arrangement and door motion events may be detected by searching for specific characteristics in the time profile of such electric supply current. Upon detecting a multiplicity of door motion events, these door motion events may be distinguished from each other and may be classified by comparing an actual duration of each of the detected door motion events with the learned reference motion event durations determined during the learning phase. Accordingly, upon such comparison, the type of each detected door motion event may be associated to one of the types as identified during the learning phase.

In other words, for each detected door motion event, it may be decided whether it was a door opening motion, a door closing motion or a door reversal motion by comparing the duration of the present door motion event with each of the predetermined reference motion event durations.

Accordingly, occurrences of each type of door motion events may be for example counted, thereby enabling deriving information about any wear typically occurring upon a specific number of door motion events having been performed.

Alternatively or additionally, the actual duration of a specific door motion event as detected during the application phase may be compared with the corresponding reference motion event duration as determined during the learning phase. Upon substantial deviations occurring in such actual duration and reference duration, this may be taken as indicating for example failures or deteriorations occurring during operation of the car door arrangement.

According to an embodiment, during the learning phase, a door arrangement operation is observed such as to detect door motion events and the identifying of different types of door motion events is performed automatically based on the detected door motion events and the determining of the reference motion duration for each door motion type is performed automatically based on the detected door motion events.

In other words, the processes to be executed during the learning phase shall preferably be performed in an automatic manner or at least a semi-automatic manner, where no or little human interaction is required. Specifically, the door motion events may be observed automatically using technical means such as for example those described in more detail further below. Furthermore, the processes of identifying the different types of door motion events as well as determining the reference motion event durations for the different types of door motion events shall be performed in an automatic manner.

Specifically, upon observing the door arrangement operation and detecting the door motion events such as an opening, a closing or a reversal motion, specific or learned characteristics of such detected door motion events may first be used for identifying to which one of possible types of door motion events the present door motion event corresponds. After having identified the door motion events observed during the learning phase, the reference motion durations may be used to determine the type of door motion event in an automatic manner.

Explained with reference to an example, a door opening motion may be observed during the learning phase. At that stage, it is not yet known that the observed door motion event is a door opening motion but it is only known that the door is moving. However, specific parameters of such door motion may be observed. For example, a duration of such door motion may be observed. If the specific door motion occurs for the first time during the learning phase, a new type of door motion event is generated and its observed specific parameters, such as its duration, are stored. If, during subsequent stages of the learning phase, another door motion of the same type is observed, this can be recognized due to its specific parameters being the same as in the first observation. After a sufficient time of for example several minutes or hours, it may be assumed that all possible types of door motion events have occurred at least once, preferably multiple times, during the learning phase observation. Accordingly, it may be assumed that all door motion events to be observed during a future application phase may be attributed or associated to one of the types of door motion events observed and identified during the learning phase.

After having identified all possible types of door motion events, an average time required to perform the door motion events may be determined and stored as a so-called reference motion duration for each of the determined types of door motions.

As explained with reference to the above example, when it is determined that there are three types of door motion events, i.e. door opening, door closing and door reversal, a value for any motion duration may be classified to one of the three event types. Possibly, no exact values but values including a tolerance range may be attributed. For example, it may be determined that a door opening event generally requires 3 s±0.2 s, a door closing event generally requires 4.7 s±0.3 s and a door reversal event requires 2.5 s±1.8 s.

Later, during the application phase, this information may be used for detecting the type of an observed door motion event such that for example occurrences of each type of door motion event may be counted. For example, if a door motion event having a duration of 4.5 s is observed, it may be assumed that this door motion is a door closing motion. If a door motion event having a duration of 1 s is observed, it may be assumed that this door motion is a door reversal motion. In cases where no unambiguous decision may be taken based on the observed motion event duration only, further information and/or measured characteristics may be taken into account for coming to a final decision on the type of door motion event.

According to an embodiment, the door motion events may be detected by measuring and analyzing electric supply currents to the electric actuator.

In other words, whether or not the observed elevator door moves may be detected by measuring and analyzing electric currents supplied to the electric actuator used for displacing the elevator door. As long as the elevator door remains stationary, such electric actuator is generally in an idle mode and consumes no or only little electric energy. However, as soon as the elevator door is to be moved, electricity is supplied for example by a door controller to the electric actuator. This can be detected for example by directly or indirectly measuring flowing electric currents in supply lines between the electric actuator and an energy supply source. For example, such electric currents may be measured using a Hall sensor arranged adjacent to such supply line. Details on possibilities for measuring such electric currents are disclosed for example in the applicant's prior application WO 2017/016876 A1. Measuring and analyzing electric supply currents to the electric actuator of the elevator door is an option for detecting door motion events in a simple to implement manner and/or with a high reliability.

According to a specific implementation of the previous embodiment, the door motion events may be detected by inspecting a time profile of the measured electric supply currents for the presence of edges with a gradient of the electric supply currents exceeding a predetermined gradient value.

In other words, for example a start or an end of a door motion event may be detected by continuously observing an electric supply current and analyzing whether such current suddenly and significantly changes, i.e. raises or drops, with a steep gradient. For example, if the observed electric supply current suddenly and steeply raises from a low initial level, this may be taken as indicating that a door motion event starts, i.e. the supplied actuator starts to open or close the door. Similarly, a steep decrease in the supply current may represent an end of a door motion event. Such analysis/inspection is sometimes also referred to as "step detection", "shift detection", "jump detection" or "edge detection" and may be applied to electric current patterns or electric current profiles in order to search for specific events which result in significantly differing electric current flows. Such approach of door motion event detection may be applied specifically during the learning phase, but could in principle also be applied during the application phase.

According to an embodiment, the identification of different types of door motion events during the learning phase comprises (i) a first step including measuring an electric supply current v to the electric actuator during a first time period including a plurality of door motion events, detecting a minimum current $v_{min}$ and a maximum current $v_{max}$ occurring during the first time period and setting a threshold current value $v_{thresh}$ to $v_{thresh}=v_{min}+(\alpha*(v_{max}-v_{min}))$ with $\alpha$ being a predefined factor value between 0 and 1; and (ii) a second step including measuring an electric supply current v to the electric actuator during a second time period including a plurality of door motion events and identifying the different types of door motion events based on characteristics of time periods with the measured electric supply current v exceeding the threshold current value $v_{thresh}$.

In other words, the process of identifying different types of door motion events during the learning phase may be separated into two steps to be performed one after the other.

In the first step, a threshold current value is set. This threshold current value shall later, i.e. in the second step, be used in order to recognize whether or not a door motion event is currently performed. For that purpose, the electric supply current to the electric actuator is measured during the first time period and the threshold current value $v_{thresh}$ is set to a value somewhere between the minimum current value $v_{min}$ and the maximum current value $v_{max}$ occurring during this first time period, i.e. $v_{thresh}=v_{min}+(\alpha*(v_{max}-v_{min}))$. For example, the threshold current value $v_{thresh}$ may be set to be in the middle between the minimum current value $v_{min}$ and the maximum current $v_{max}$. This corresponds to the predefined factor value $\alpha$ being 0.5. It's also possible to determine several minimum current values $v_{min}$ and the maximum current values $v_{max}$ occurring during this first time period and to use the mean or the median of the different values for setting the threshold current value $v_{thresh}$.

Later, during the second step, a time period may be defined in which the observed electric supply current v exceeds this pre-set threshold current value $v_{thresh}$ and the observed door motion events may be identified based on characteristics of these time periods.

For example, according to a specific implementation of such embodiment, in the second step, the different types of door motion events may be identified based on durations of time periods with the measured electric supply current v exceeding the threshold current value $v_{thresh}$.

Expressed differently, after having set the threshold current value $v_{thresh}$ in the first step of the learning phase, all door motion events observed during the second step of the learning phase may be detected upon the measured electric supply current exceeding this threshold current. Upon having detected a door motion event, this door motion event may be identified into one of plural types of door motion events upon taking into account the duration of the time period in which the measured electric supply current exceeds the threshold current value. Accordingly, the duration of the time period during which the measured electric supply current is higher than the threshold current value may be taken as a decision parameter indicating to which type of door motion events the currently observed door motion event belongs.

Similarly and in accordance with a specific implementation of the above embodiment, the determining of the reference motion duration for each door motion type is performed based on analyzing a measured duration in which the electric supply current as measured during the second step exceeds the threshold current value $v_{thresh}$.

In other words, not only the process of identifying observed door motion events but also the process of determining the reference motion durations for each of the identified door motion types may be performed taking into account the time period in which the electric supply current exceeds the threshold current value during the second step of the learning phase. Particularly, the reference motion duration of an observed door motion event may be set to correspond to the time period during which the electric supply current exceeds the threshold value, such time period representing or at least correlating to the actual time during which the elevator door is moved.

In a specific implementation of the above embodiment, the factor value α is pre-set to a default value of between 0.3 and 0.7, preferably to a default value of between 0.4 and 0.6 or to a default value of 0.5, and is tunable to values of between 0 and 1, preferably to values of between 0.1 and 0.9, in an expert configuration step.

In other words, the factor value α indicates at which level the threshold current value $v_{thresh}$ is to be set between the detected minimum current $v_{min}$ and the detected maximum current $v_{max}$ as occurring during the first step of the learning phase. In principle, this factor value α may be somewhere between 0 and 1. However, it may be preferable to generally set this factor value α to a default value of e.g. 0.5±0.2, such that the threshold current value $v_{thresh}$ is positioned near to the middle between the detected minimum current $v_{min}$ and the detected maximum current $v_{max}$. Such positioning may result in a reliable detection of door events upon detecting that the actual measured current value exceeds the set threshold current value $v_{thresh}$.

However, in specific situations or for specific types of elevators, it may be beneficial or even necessary to tune the factor value α, i.e. to change such factor value α to deviate from the default value of e.g. 0.5±0.2 towards higher or lower values. Particularly, it may sometimes be beneficial to set the threshold current value $v_{thresh}$ to a value relatively close to the detected minimum current $v_{min}$, for example in order to obtain a high sensitivity upon detecting door motion events. In such case, the factor value α may be set to a small value of for example between 0.1 and 0.3. In other cases, it may be beneficial to set the threshold current value $v_{thresh}$ to a value relatively close to the detected maximum current $v_{max}$, for example in order to obtain a reduced sensitivity in detecting door motion events, thereby for example reducing possible influences of signal noise. In such case, the factor value α may be set to a high value of for example between 0.7 and 0.9.

The step of tuning the factor value α generally requires specific knowledge about the elevator and its operation and should therefore be performed in an expert configuration step, i.e. by specifically trained personnel. Accordingly, access to such expert configuration may be restricted. For example, tuning the factor value α may only be allowed upon an expert having authorized himself by suitable measures, for example by entering a code into a human-machine interface, unlocking an interface with a key or similar measures.

After having completed the learning phase, each of possible door motion events has being identified and reference motion event durations have been determined and attributed to each identified type of door motion events. Based on such preparations, door motion events may then be recognized during the application phase and it may be determined to which of the identified types of door motion events they belong due to a comparison of their actual motion event durations with the reference motion event durations.

For example, according to an embodiment, during the application phase, numbers of occurrences of the door motion events for each of the types of door motion events may be counted and monitoring results may be generated based on the counted numbers.

In other words, as the different types of door motion events may be distinguished by comparison of the actual motion event durations with the reference motion event durations, occurrences of each type of door motion events may be distinguished from each other and numbers of such occurrences may be counted for example during operation of the elevator. Such counted numbers of occurrences may be a valuable source of information for example upon monitoring elevator operation.

For example, such counted numbers of occurrences may serve as indicators upon planning maintenance work. E.g. a counted number of specific door motion events may indicate that the elevator door may come close to its end of service life, such end of service life being defined by a maximum number of door motion events having been performed.

The counted number of occurrences of a specific door motion event or another monitoring result derived from such information may be generated and may be for example transmitted to a remote control center of the elevator. Upon receiving such monitoring results, valuable information about a current status of the elevator may be derived. Such information may be used for example for planning future maintenance work.

Embodiments of the method proposed herein may be performed or controlled by a monitoring device for monitoring operation of an elevator door arrangement in accordance with the above-mentioned second aspect of the invention. Particularly, such monitoring device may include or may be connected to means for observing door motion events. Specifically, the monitoring device may obtain information about door motion events for example from sensors sensing e.g. an electric supply current to the actuator of the elevator door arrangement. Furthermore, the monitoring device may comprise a central processing unit CPU and/or an electronic memory unit with which obtained information about door motion events may be processed and/or stored. Signal communication with sensors may be via hardwiring or wireless. The monitoring device may be an integral component of the elevator. Alternatively, the monitoring device may be a component being provided at a remote control center and may obtain information about door motion events via sensors provided in the elevator and transmitting sensor signals to the remote control center.

Additionally, the monitoring device may be connected to further sensors e.g. microphones or acceleration sensors for receiving additional sensor signals for assessing the door motion events and/or transmitting to the remote control center.

Furthermore, embodiments of the method proposed herein may be performed or controlled by executing a computer program product in accordance with the above-mentioned fourth aspect of the invention. Such computer program product may be executed for example in a programmable monitoring device according to the second aspect of the invention. The computer program product may be programmed in any computer readable language.

Finally, embodiments of the computer readable medium in accordance with the above-mentioned fifth aspect of the invention may be any computer readable medium being able to store the described computer program product. For example, the computer readable medium may be a CD, a DVD, a flash ROM, a PROM or EPROM, etc. Furthermore, the computer readable medium may be a computer or server from which the computer program product may be downloaded.

It shall be noted that possible features and advantages of embodiments of the invention are described herein partly with respect to a monitoring method and partly with respect to a monitoring device. One skilled in the art will recognize that the features may be suitably transferred from one embodiment to another and features may be modified, adapted, combined and/or replaced, etc. in order to come to further embodiments of the invention.

In the following, advantageous embodiments of the invention will be described with reference to the enclosed drawings. However, neither the drawings nor the description shall be interpreted as limiting the invention.

The figures are only schematic and not to scale. Same reference signs refer to same or similar features.

DETAILED DESCRIPTION

Figure 1:
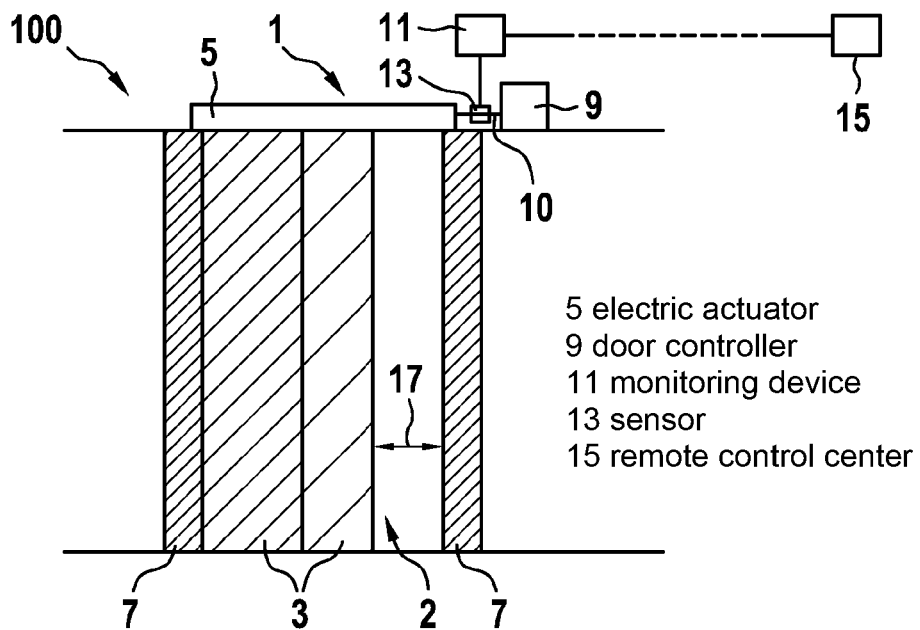
FIG. 1 shows an elevator door arrangement to be monitored with a method in accordance with an embodiment of the present invention.

FIG. 1 shows an elevator door arrangement 1 of an elevator 100, in which a method for monitoring an operation of the elevator door arrangement 1 in accordance with an embodiment of the present invention may be implemented. The elevator door arrangement 1 may be provided at an entrance to an elevator car 2. Particularly, the elevator door arrangement 1 may be implemented as an elevator car door arrangement or, alternatively, as an elevator shaft door arrangement.

The elevator door arrangement 1 comprises two door wings 3 which may be displaced relative to a door frame 7 in opposite opening and closing directions 17 for opening and closing an access to the elevator car 2. A displacement of the door wings 3 may be driven by an electric actuator 5. Such electric actuator 5 may comprise an electric motor which pushes and draws, respectively, the door wings the 3 during opening and closing motions and which is controlled and supplied with electric energy via a door controller 9 connected to the electric actuator 5 via a cable 10.

A monitoring device 11 may be used for monitoring the operation of the elevator door arrangement 1. The monitoring device 11 is configured to observe door motion events performed by the elevator door arrangement 1. In principle, various means for observing such door motion events are possible. For example, a door motion may be observed using a camera system or various other types of sensors directly or indirectly supervising components of the elevator door arrangement 1.

In the embodiment shown in FIG. 1, the monitoring device 11 comprises or is connected to a sensor 13 which may sense an electric energy supply from the controller 9 to the electric actuator 5. For example, the sensor 13 may be a Hall sensor which may sense magnetic fields generated upon an electric current flowing through the cable 10. Accordingly, the sensor 13 may be attached to or arranged in close proximity to the cable 10. The monitoring device 11 may be adapted for receiving and/or analyzing signals from the sensor 13 such as to derive information about a current status of the elevator door arrangement 1. For that purpose, the monitoring device 11 may comprise a central processing unit and/or some electronic memory. Alternatively or additionally, the monitoring device 11 may communicate with a remote control center 15. Therein, the monitoring device 11 may directly forward signals received from the sensor towards the remote control center 15 or, alternatively, the monitoring device 11 may first perform some analysis with such sensor signals before forwarding some pre-processed analysis results to the remote control center 15. Based on the signals and information received from the monitoring device 11, the remote control center 15 may derive valuable information about a current status of the elevator door arrangement 1.

While the hardware of the elevator door arrangement 1 and its monitoring device 11 may be similar to the one described in the applicant's prior application WO 2017/016876 A1, it may be operated in a more automated manner by performing the method for monitoring the operation of the elevator door arrangement 1 described herein.

Particularly, when detecting elevator door events based on electric current signals measured from for example an energy supply to an elevator door actuator, thresholding current signal values may allow detection of these door events.

However, for example a variability of motor types may require different threshold values and, in the prior art approaches, this was set manually by inspecting the current signal. Accordingly, technical expertise was required and additional work efforts where necessary for initializing the monitoring device and/or calibrating suitable threshold values.

In contrast to prior art approaches, it is proposed herein that threshold values may be learned and set automatically, for example by suitably analyzing an electric current signal obtained upon inspecting energy supply to the electric actuator 5 of the elevator door arrangement 1.

The proposed method may be divided into a learning phase and an application phase. During the learning phase, in a first step, different types of door motion events such as "door closing", "door opening" and "door reversal" may be distinguished such that every occurring door motion may be attributed or categorized to one of such types of door motion events. Subsequently, in a second step, a reference motion event duration is determined for each type of door motion event.

Later, during the application phase, the door arrangement operation is continuously or repeatedly observed such as to detect door motion events. In case, a door motion event is detected, its identity or type may be distinguished from other door motion events upon comparison of the reference motion event duration with an actual motion event duration as it is measured during the application phase.

Figure 2:
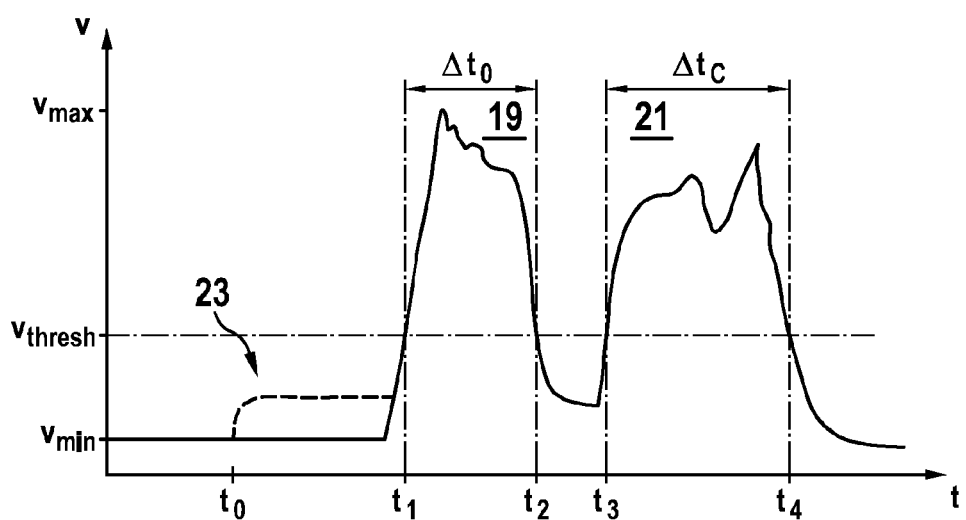
FIG. 2 shows a time-dependency of a supply current of an elevator door arrangement to be monitored with a method in accordance with an embodiment of the present invention.

Next, an example of an embodiment of the proposed monitoring method will be explained with reference to FIG. 2. Therein, FIG. 2 represents a time-dependence profile of an electric current v which is supplied from the door controller 9 via the cable 10 to the electric actuator 5 of the elevator door arrangement 1 and which has been measured using the sensor 13 in order to then be analyzed in the monitoring device 11.

During the learning phase, a signal representing the electric current v is collected during a first time period such as to ensure that multiple door motion events 19, 21 have been captured for the learning phase. While only two door motion events 19, 21 are represented in FIG. 2, it may be noted that the entire first time period generally covers a multiplicity of such door motion events, for example more than ten or preferably more than 100 of such door motion events.

A threshold current value $v_{thresh}$ may be determined as follows: a minimum current $v_{min}$ and a maximum current $v_{max}$ occurring throughout the first time period may be detected. Upon having determined these minimum and maximum current values $v_{min}$, $v_{max}$, the threshold current value $v_{thresh}$ is set somewhere between these two extremes, i.e.

$$v_{thresh} = v_{min} + (\alpha*(v_{max} - v_{min}))$$

with the factor value α being between 0 and 1.

Then, in a second time period of the learning phase, the electric supply current v to the electric actuator 5 is again measured over a plurality of door motion events 19, 21. Therein, a door motion event 19, 21 may be recognized upon the electric current v exceeding the previously determined current threshold value $v_{thresh}$. In other words, when the measured electric supply current v starts exceeding the threshold current value $v_{thresh}$ at points in time $t_1$, $t_3$, it may be assumed that a door motion event starts, and when the measured electric supply current v stops exceeding the threshold current value $v_{thresh}$ at points in time $t_2$, $t_4$, it may be assumed that a door motion event ends. The points in time $t_1$ to $t_4$ may be detected using for example edge detection techniques.

From the dashed vertical lines in FIG. 2, the ending of the actual door opening and door closing events 19, 21 may be slightly offset based on decision boundaries set by the threshold values. Since this offset is generally constant with respect to the electromechanical properties of the door actuator 5, domain experts may manually correct this offset if desired. For applications such as defect detection or anomaly detection, where a key signal is a change in door event timings as opposed to actual timings, an offset correction may not be mandatory.

Then, each recognized door motion event 19, 21 may be identified as being one of a plurality of possible types of door motion events. Therein, identifying the different types of door motion events may be based on characteristics of time periods Δt with the measured electric supply current v exceeding the threshold current value $v_{thresh}$.

For example, it may be known that there are three different types of door motion events 19, 21 including a door opening event 19, a door closing event 21 and a door reversal event (not explicitly represented in the figure). Furthermore, it is generally known that the door closing event 21 requires more time than the door opening event 19. This is true as elevator doors are generally displaced more slowly during closing operations than during opening operations for passenger safety. Furthermore, it is generally known that a door reversal event in most cases takes less time than door opening events and door closing events. However, there may be exceptions when the elevator door has already almost completely closed before being reversed. In other words, the door reversal events have larger tolerances with respect to the durations compared to the door opening events and door closing events. Furthermore, as an additional information, it may be taken into account that, during normal operation of the elevator, the number of door opening events and the number of door closing events corresponds to each other with a difference of at most one, as the elevator door may only be closed when it has been opened before and vice versa.

Taking all this information into account, the door motion events 19, 21 collected during the second time period of the learning phase may be categorized. Therein, it may be assumed that those door motion events 21 having the longest motion event duration $\Delta t_c$ correspond to door closing events 21 and those door motion events 19 having a shorter motion event duration $\Delta t_o$ generally correspond to door opening events 19. For all other observed door motion events, it may be assumed that they belong to door reversal events.

If there are ambiguities upon determining a category of a door motion event, additional information such as the correspondence of the number of door openings and door closings may be taken into account for coming to a categorization.

After having categorized all encountered door motion events 19, 21, reference motion event durations may be attributed to each type of door motion event 19, 21. For example, an average of motion event durations $\Delta t_c$ of door closing events observed during the learning phase may be attributed as the reference motion event duration of the door closing events 21. Similarly, an average of motion event durations $\Delta t_o$ of door opening events observed during the learning phase may be attributed as the reference motion event duration of the door opening events 19.

In FIG. 2, another possible implementation of elevator door operation is indicated. In this implementation, upon receiving a call for elevator operation, i.e. a call requesting the elevator car to come to a specific floor, the actuator 5 is first brought from an idle mode to a standby mode at a point in time $t_0$. While, in the idle mode, the elevator door arrangement 1 is in its unlocked state and the actuator 5 consumes almost no electricity, in the standby mode, the elevator door arrangement 1 is locked and the actuator 5 is provided with a small amount of electricity while waiting for becoming active to displace the door wings 3. The step 23 in the electric supply current v occurring upon transition to this standby mode may be taken into account upon subsequent door motion event detection.

Based on the preparations performed during the learning phase, the monitoring method may then, during the application phase, differentiate between various types of door motion events 19, 21 by comparing actual motion event durations as measured during the application phase with those reference motion event durations determined during the learning phase.

For example, upon being able to distinguish different types of door motion events, numbers of occurrences of each type of door motion event 19, 21 may be counted. Such information may be for example transmitted to the remote control center 15 and may be taken into account upon planning any future maintenance work.

The approach proposed herein may allow various advantages compared to prior art approaches. For example, compared to manual threshold labelling, the described approach may allow for higher generalizability with lower manual effort. Furthermore, the approach described does not necessarily require training data where labelled signal segments are used to "teach" a machine learning system by example. Furthermore, sensor based door segmentation may be enabled for a wide range of elevator models.

Finally, it should be noted that the term "comprising" does not exclude other elements or steps and the "a" or "an" does not exclude a plurality. Also, elements described in association with different embodiments may be combined.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A method for monitoring an operation of an elevator door arrangement having at least one door wing and an electric actuator for displacing the door wing in at least one of an opening direction and a closing direction during a door motion event, the method comprising the steps of:
    performing a learning phase during which different types of the door motion event are detected and identified, and learning a reference motion event duration for each the types of the door motion events; and
    performing an application phase during which an operation of the door arrangement operation is observed to detect subsequent ones of the door motion events, measuring an actual motion event duration for each of the detected door motion events and distinguishing the type of each of the detected door motion events by comparing the learned reference motion event durations with the actual motion event duration of the detected door motion event.

2. The method according to claim 1 wherein, during the learning phase, a door arrangement operation is observed to detect the door motion events that occur, the identifying of the different types of the door motion events is performed automatically based on the detected door motion events and the determining of the reference motion event duration for each type of door motion events is performed automatically based on the detected door motion events.

3. The method according to claim 1 wherein the door motion events are detected by measuring and analyzing electric supply currents flowing to the electric actuator.

4. The method according to claim 3 wherein the door motion events are detected by inspecting a time profile of the measured electric supply currents for a presence of edges with a gradient of the electric supply currents exceeding a predetermined gradient value.

5. The method according to claim 1 wherein the identifying of the different types of the door motion events during the learning phase comprises:
    a first step of measuring an electric supply current flowing to the electric actuator during a first time period including a plurality of the door motion events, detecting a minimum current value $v_{min}$ and a maximum current $v_{max}$ occurring during the first time period and setting a threshold current value equal to $v_{min}+(\alpha^*(v_{max}-v_{min}))$ with $\alpha$ being a predefined factor value between 0 and 1; and
    a second step of measuring the electric supply current flowing to the electric actuator during a second time period including another plurality of the door motion events and identifying the different types of the door motion events during the second time period based on characteristics of time periods when the measured electric supply current exceeds the threshold current value.

6. The method according to claim 5 wherein, in the second step, the different types of the door motion events are identified based on durations of the time periods with the measured electric supply current exceeding the threshold current value.

7. The method according to claim 5 wherein a reference motion duration for each of the types of the door motion events is determined based on analyzing a measured duration in which the electric supply current as measured during the second step exceeds the threshold current value.

8. The method according to claim 5 including pre-setting the factor value to a default value of between 0.3 and 0.7 and wherein the factor value is tunable to values between 0 and 1 in an expert configuration step.

9. The method according to claim 5 including, during the application phase, counting numbers of occurrences of the door motion events for each of the types of the door motion events and generating monitoring results based on the counted numbers.

10. A monitoring device for monitoring an operation of an elevator door arrangement, the monitoring device being adapted to perform the method according to claim 1.

11. An elevator comprising: an elevator door arrangement and a monitoring device according to claim 10 monitoring the operation of the elevator door arrangement.

12. A non-transitory computer readable medium comprising: computer readable instructions stored thereon which, when loaded into and performed by a processor of a monitoring device, instruct the monitoring device to perform the method according to claim 1.

13. A computer program product comprising the non-transitory computer readable medium according to claim 12 stored thereon for performing the method.

* * * * *